United States Patent [19]
Hassan et al.

[11] Patent Number: 5,773,895
[45] Date of Patent: Jun. 30, 1998

[54] ANCHOR PROVISIONS TO PREVENT MOLD DELAMINATION IN AN OVERMOLDED PLASTIC ARRAY PACKAGE

[75] Inventors: Altaf Hassan, Chandler; Bidyut K. Bhattacharyya, Phoenix, both of Ariz.

[73] Assignee: Intel Corporation, Santa Clara, Calif.

[21] Appl. No.: 627,058

[22] Filed: Apr. 3, 1996

[51] Int. Cl.[6] .............................. H01L 23/48; H01L 23/52
[52] U.S. Cl. ......................... 257/774; 257/692; 257/778; 257/796; 361/774; 361/783
[58] Field of Search .................................... 257/774, 778, 257/787, 796, 692; 361/774, 783, 820

[56] References Cited

U.S. PATENT DOCUMENTS

| | | | |
|---|---|---|---|
| 4,396,936 | 8/1983 | McIver et al. | 257/796 |
| 4,625,227 | 11/1986 | Hara et al. | 257/787 |
| 4,814,943 | 3/1989 | Okuaki | 257/787 |
| 5,255,157 | 10/1993 | Hegal | 257/787 |
| 5,329,162 | 7/1994 | Nakaoka | 257/774 |
| 5,336,931 | 8/1994 | Juskey et al. | 257/787 |
| 5,367,191 | 11/1994 | Ebihara | 257/787 |
| 5,461,197 | 10/1995 | Hiruta et al. | 257/787 |
| 5,485,037 | 1/1996 | Marrs | 257/787 |
| 5,552,639 | 9/1996 | Hara et al. | 257/787 |
| 5,565,709 | 10/1996 | Fukushima et al. | 257/787 |

*Primary Examiner*—Tom Thomas
*Assistant Examiner*—David Ostrowski
*Attorney, Agent, or Firm*—Blakely, Sokoloff, Taylor & Zafman

[57] ABSTRACT

An overmolded plastic integrated circuit package which contains an integrated circuit that is mounted to a first surface of a printed circuit board. The integrated circuit is electrically coupled to a plurality of external contacts located on an opposite second surface of the printed circuit board. The integrated circuit is encapsulated and protected by a molded plastic compound. The printed circuit board has slots that receive a portion of the molded plastic material. The plastic filled slots anchor the outer encapsulant to the printed circuit board and prevent delamination between the interface of the circuit board and the adjacent encapsulant material.

13 Claims, 2 Drawing Sheets

ANCHOR PROVISIONS TO PREVENT MOLD DELAMINATION IN AN OVERMOLDED PLASTIC ARRAY PACKAGE

BACKGROUND OF THE INVENTION

1. FIELD OF THE INVENTION

The present invention relates to a plastic package for an integrated circuit.

2. DESCRIPTION OF RELATED ART

FIG. 1 shows an electronic package of the prior art that is commonly referred to as an Overmolded Plastic Array Package (OMPAC). An OMPAC package has an outer molded plastic compound 2 which encapsulates an integrated circuit 4 that is mounted to a substrate 6. The substrate 6 is typically a printed circuit board that has bonding fingers 8 that are coupled to the integrated circuit 4 by bonding wires 10. The bonding fingers 8 are typically routed to external solder balls 12 by internal vias within the board 6.

It has been found that the interface between the molded plastic 2 and the substrate 6 may contain cracks or channels 14 that are created when the plastic becomes delaminated from the circuit board 6. The cracks 14 may allow moisture to penetrate the package and contaminate the integrated circuit 4. It would be desirable to provide an overmolded plastic package that is not susceptible to delamination between the plastic and the underlying substrate.

SUMMARY OF THE INVENTION

The present invention is an overmolded plastic integrated circuit package which contains an integrated circuit that is mounted to a first surface of a printed circuit board. The integrated circuit is electrically coupled to a plurality of external contacts located on an opposite second surface of the printed circuit board. The integrated circuit is encapsulated and protected by a molded plastic compound. The printed circuit board has slots that receive a portion of the molded plastic material. The plastic filled slots anchor the outer encapsulant to the printed circuit board and prevent delamination between the interface of the circuit board and the adjacent encapsulant material.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
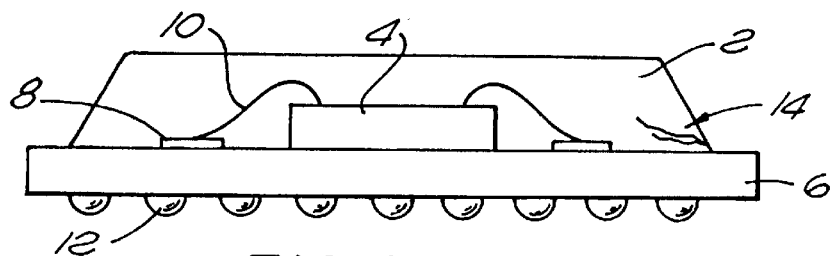
FIG. 1 is a side cross-sectional view of an integrated circuit package of the prior art.
Figure 2:
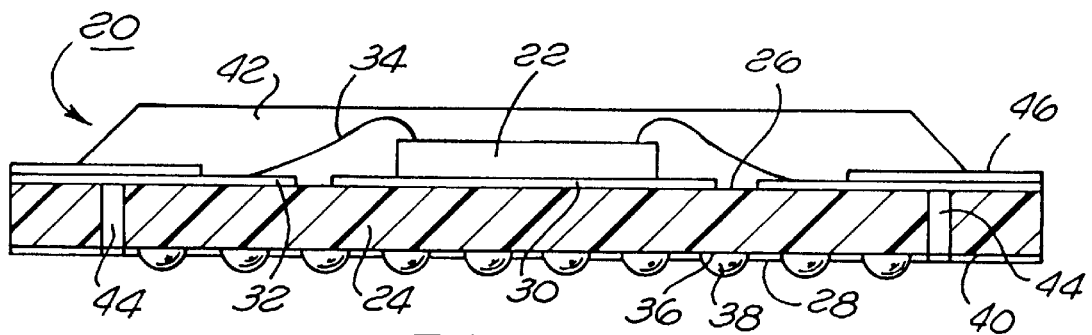
FIG. 2 is a side cross-sectional view of an integrated circuit package of the present invention.
Figure 3:
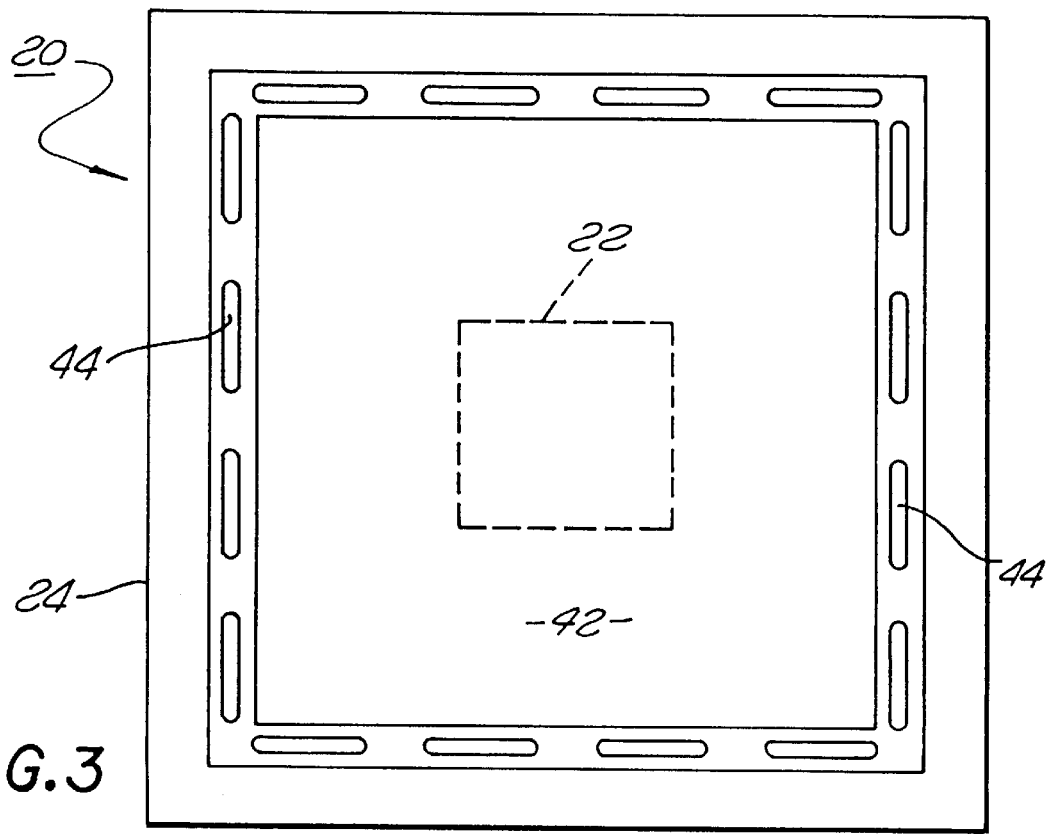
FIG. 3 is a top view of a printed circuit board of the package shown in FIG. 2.

Referring to the drawings more particularly by reference numbers, FIGS. 2 and 3 show an integrated circuit package 20 of the present invention. The package 20 includes an integrated circuit 22 that is mounted to a substrate 24. The integrated circuit 22 may be a microprocessor or any other electronic device. Although only one integrated circuit is shown and described, it is to be understood that the package 20 may contain a plurality of integrated circuits. Additionally, although an integrated circuit is shown and described, it is to be understood that the package 20 may contain any active or passive electrical device.

The substrate 24 is typically a printed circuit board which has a first surface 26 and an opposite second surface 28. The printed circuit board 24 has a die pad 30 and a plurality of bonding fingers 32 located on the first surface 26. The integrated circuit 22 is mounted to the die pad 30 and coupled to the bonding fingers 32 by a plurality of bonding wires 34. The bonding fingers 32 are coupled to a plurality of contact pads 36 by a number of conductive vias (not shown) that extend through the printed circuit board 24. Solder bumps 38 are attached to the contact pads 36. The solder bumps 38 are typically reflowed to attach the package 20 to an external printed circuit board (not shown). A solder mask 40 may be applied to the second surface 28 of the circuit board 24 to prevent the bumps 38 from shorting together during the reflow process of the solder. Although a plurality of solder bumps 38 are shown and described, it is to be understood that other contacts such as pins can be attached to the substrate 24 and soldered or socketed to the external printed circuit board.

The integrated circuit 22 is encapsulated by a molded plastic compound 42. The plastic material also covers a portion of the printed circuit board 24. The printed circuit board 24 contains a plurality of slots 44 which extend from the first surface 26 to the second surface 28. The slots 44 are typically arranged in a rectangular pattern about the printed circuit board 24. The plastic flows into the slots 44 during the mold process, to anchor the outer plastic shell 42 to the printed circuit board 24, and to prevent the plastic 42 from delaminating from the first surface 26.

The first surface 26 may also have an outer layer 46 which creates a step in the package 20 and further increases the adhesion between the plastic 42 and the substrate 24. The outer layer 46 may be formed from an etched or plated copper conductor. Alternatively, the outer layer 46 may be formed by laminating an additional layer of dielectric to the printed circuit board 24. The anchoring slots 44 and the stepped outer layer 46 reduce the possibility of delamination and cracking between the plastic/substrate interface, and prevent moisture from migrating to the integrated circuit 22.

To assemble the package, the substrate 24 is typically constructed using conventional printed circuit processes. The slots 44 may be formed by any cutting, stamping, etching, routing, etc. technique. The solder mask 40 is typically applied to the second surface 28 of the circuit board 24 except where the solder bumps 38 are to be soldered to the contact pads 36. The integrated circuit 22 is mounted to the die pad 30 and wire bonded to the bonding fingers 32.

The substrate 24 and integrated circuit 22 are then placed into a mold (not shown). The mold is injected with a plastic compound that encapsulates the integrated circuit 22. The plastic is injected into the mold at a high enough pressure to push the plastic into the slots 44. The size of the slots 44 can be designed to allow the plastic to adequately flow through the circuit board 24 with conventional molding pressures, temperatures, etc.

After the plastic is hardened, the package is removed from the mold and the solder bumps 38 are attached to the contact pads 36. The solder bumps 38 are typically attached by soldering solder balls onto the pads 36 with conventional ball grid array (BGA) processes.

Figure 5:
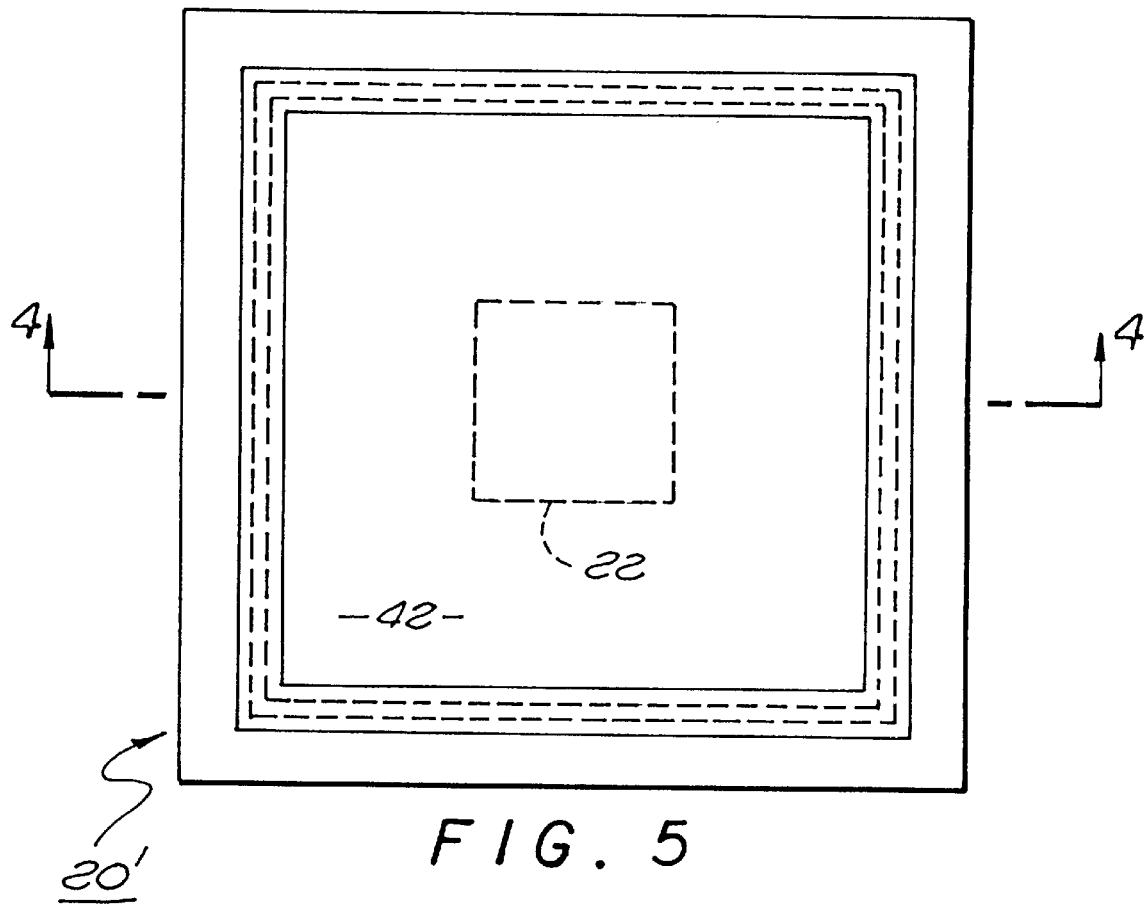
FIG. 5 is a top view of a printed circuit board of the package shown in FIG. 4.
Figure 4:
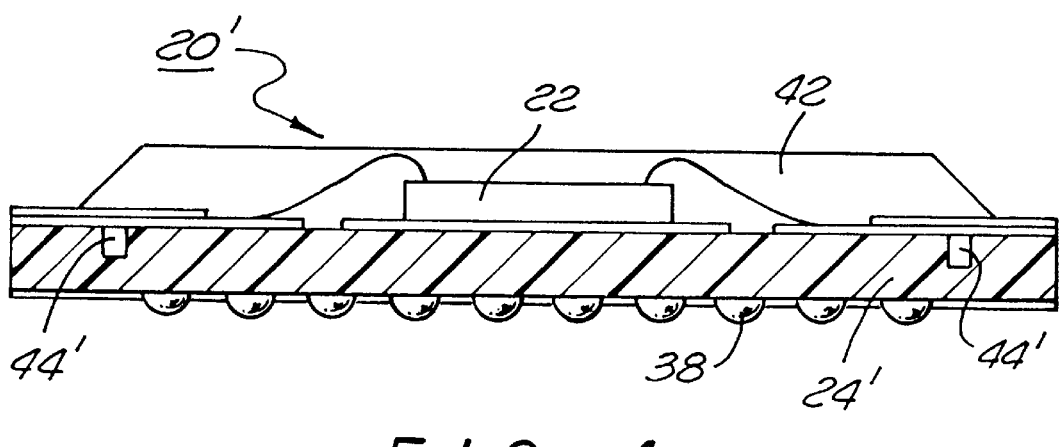
FIG. 4 is a side cross-sectional view of an alternate embodiment of the package of FIG. 2.

FIGS. 4 and 5 show an alternate embodiment of a package 20' which has a multi-layer printed circuit board 24'. The substrate 24' may have a single rectangular slot 44' which extends into one or more layers of the circuit board 24'. The plastic compound 42 extends into the slot 44' to anchor the plastic to the substrate 24'. The slot 44' is located in the outer perimeter of the substrate to minimize any interference with the routing of the circuit board 24'. Although a multi-layer package having a single slot that does not extend through the entire width of the substrate is shown, it is to be understood that the multiple slot configuration shown in FIG. 2 can be implemented with a multi-layer package 20' where the slot does not extend through whole thickness of the substrate. Likewise, a single layer package 20 may have a single slot 44' that does not extend through the entire circuit board.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic package, comprising:
   a substrate which has a first surface and an opposite second surface, said substrate having a slot in said first surface and an outer raised layer on said first surface, wherein said outer raised layer has a top surface;
   a contact that extends from said second surface of said substrate;
   an integrated circuit mounted to said first surface; and,
   a plastic mold compound that encapsulates said integrated circuit, wherein a portion of said plastic mold compound extends into said slot and onto said top surface of said outer raised layer of said substrate.

2. The package as recited in claim 1, wherein said substrate has a plurality of slots arranged in a rectangular pattern.

3. The package as recited in claim 1, wherein said slot extends through said substrate from said first surface to said second surface.

4. The package as recited in claim 1, wherein said substrate has a plurality of slots arranged in a rectangular pattern.

5. The package as recited in claim 1, wherein said contact is a solder ball.

6. The package as recited in claim 1, wherein said contact is a pin.

7. The package as recited in claim 1, wherein said substrate is a printed circuit board.

8. The package as recited in claim 1, wherein said integrated circuit is a microprocessor.

9. An electronic package, comprising:
   a printed circuit board which has a plurality of bonding fingers on a first surface, said bonding fingers being coupled to a plurality of contact pads on an opposite second surface of said printed circuit board, said printed circuit board having a slot in said first surface and an outer raised layer on said first surface, wherein said outer raised layer has a top surface;
   a plurality of solder balls that are attached to said contact pads;
   an integrated circuit mounted to said first surface and coupled to said bonding fingers; and,
   a plastic mold compound that encapsulates said integrated circuit, wherein a portion of said plastic mold compound extends into said slot and onto said top surface of said outer raised layer of said printed circuit board.

10. The package as recited in claim 9, wherein said printed circuit board has a plurality of slots arranged in a rectangular pattern.

11. The package as recited in claim 9, wherein said slot extends through said substrate from said first surface to said second surface.

12. The package as recited in claim 9, wherein said slot is arranged in a rectangular pattern.

13. The package as recited in claim 9, wherein said integrated circuit is a microprocessor.

* * * * *